United States Patent [19]
Honda

[11] Patent Number: 5,734,973
[45] Date of Patent: Mar. 31, 1998

[54] RADIO RECEIVER FOR SELECTIVELY RECEIVING SIGNALS AT FREQUENCIES OF PREVIOUSLY STORED BROADCAST STATIONS

[75] Inventor: Kanji Honda, Tokyo, Japan

[73] Assignee: Clarion Co., Ltd., Tokyo, Japan

[21] Appl. No.: 637,247

[22] Filed: Apr. 24, 1996

[30] Foreign Application Priority Data

Apr. 25, 1995 [JP] Japan ................................ 7-124227

[51] Int. Cl.⁶ ................................................. H04B 1/16
[52] U.S. Cl. ................................ 455/186.1; 455/184.1
[58] Field of Search ............................. 455/185.1, 186.1, 455/186.2, 184.1, 161.1, 161.2, 33.2

[56] References Cited

U.S. PATENT DOCUMENTS 5,307,513  4/1994  Harada ................... 455/186.1
5,537,674  7/1996  Kishimoto ............... 455/186.1

Primary Examiner—Nguyen T. Vo
Attorney, Agent, or Firm—Koda and Androlia

[57] ABSTRACT

A radio receiver device in which a plurality of items of area data are stored in an area data storage section, and when a last area modification mode that modifies the last area data in the current settings is detected, area data that corresponds to the modified last area data is retrieved from the area data storage section, location data corresponding to the retrieved area data is retrieved from the data storage section, and it is made possible to tune to the radio stations in the retrieved location data, so that even in cases involving movement between a plurality of areas, it is unnecessary for the user to re-set and input the last area data in the area to which he or she moved every time he or she does so, and it is possible to markedly improve the operating characteristics in terms of the setting and inputting of last area data.

6 Claims, 5 Drawing Sheets

18a

| RECEPTION FREQUENCY LAST POSITION MEMORY AREA | | | | | |
|---|---|---|---|---|---|
| CH1 | CH2 | CH3 | CH4 | CH5 | CH6 |
|  |  |  |  |  |  |

| AREA DATA LAST PRESET MEMORY AREA | | | | | |
|---|---|---|---|---|---|
| CH1 | CH2 | CH3 | CH4 | CH5 | CH6 |
|  |  |  |  |  |  |

RADIO RECEIVER FOR SELECTIVELY RECEIVING SIGNALS AT FREQUENCIES OF PREVIOUSLY STORED BROADCAST STATIONS

BACKGROUND OF THE INVENTION

1. Field of the Invention

This invention relates to a radio receiver device wherein area data relating to a plurality of previously partitioned areas, and radio stations data of receivable radio stations corresponding to each of these partitioned areas, are pre-stored in a memory inside the device, and wherein the stored contents of this memory are used during station selection to obtain received signals from the desired radio station, such as a radio receiver device with ID-logic function, for example.

2. Prior Art

This sort of radio receiver device has hitherto been known in the form a radio receiver wherein area data corresponding to the area names of areas allocated on a grid, in which grid the whole country is allocated to a plurality of areas, and location data having data such as radio station data relating to such items as the reception frequency and radio station name of radio stations that can be received within this area, are pre-stored in a memory inside the device, and wherein the stored contents of this memory are used when selecting a radio station to obtain received signals from the desired radio station.

Such radio receivers are, for example, widely known as radio receiver devices with ID-logic function in the United States, which is an expansive country within which are situated a large number of radio stations.

In a radio receiver device with ID-logic function, location data relating to the radio stations in areas such as each city and each state of the United States, for example, is stored inside the device, and the user of the device must input preset data in the form of area data relating to the area corresponding to the current position of the device every time, and, if at some time the area data of the input preset data does not correspond with the area data in the location data stored inside the device, circumstances have arisen wherein an incorrect call sign is displayed with respect to the received frequency, and the function of tuning to radio stations relating to the location data stored inside the device does not function normally.

To avoid such circumstances, radio receiver devices with ID-logic function are known, which have been made with the ability to store as preset data just one item of area data that is frequently used, for example.

Conventional radio receiver devices with ID-logic function are described in the following with reference to FIG. 6.

Radio receiver device 50 with ID-logic function has receiver circuit part 11 including a receiver antenna for receiving broadcast waves arriving from a radio station, receiver control part 12 which controls this receiver circuit part 11, data storage part 13 wherein location data is stored, keypad part 14 which inputs various commands, display part 15 which displays various items of data, last area data storage part 16 which stores a single item of presetting area data, and main unit control part 17 which controls the entire radio receiver device 50.

The location data stored in data storage part 13 has various types of data relating to the radio stations situated within each area—examples including the radio station name, broadcast frequency and contents of radio programs—and area data for identifying the area in which each radio station is situated.

The area data is allocated in unit squares of about 50 km in size, for example by allocating it in state and city units, each of these units being obtained by, for example, partitioning the North American continent into a grid with lines of latitude and longitude at half-degree intervals. Note that the location data stored in data storage part 13 includes, in the United States for example, radio station data relating to about 7,500 FM radio stations and about 4,500 AM radio stations, and area data relating to these radio stations.

The preset data that is stored in last area data storage part 16 corresponds to area data relating to areas that are frequently used, for example, according to input operations from keypad part 14 described below.

Keypad part 14 includes an UP key and a DOWN key for inputting preset data and so on, and channel keys 14a in which are preset up to, for example, six radio stations as shown in FIG. 7, and which have a preset function for calling up these preset radio stations with a single keypress. Note that the UP key can make selections in alphabetical order (A, B, C ...), and the DOWN key can make selections in reverse alphabetical order (Z, Y, X ...).

Preset data is input with the UP key and DOWN key by selecting the name of the required state by using these keys to input a two-letter abbreviation of the required state, and after this selection of the required state, selecting the required city from, for example, a scrolling display of the cities in the required state previously selected.

Next, the operation of radio receiver device 50 with ID-logic function is explained with reference to FIG. 6.

First, the actions performed when receiving a radio station stored in the preset memory corresponding to each channel key are explained.

Following a channel key input in keypad part 14, main unit control part 17 sends a frequency reception request, which relates to a radio station stored in the preset memory corresponding to the channel key input, to receiver circuit part 11 via receiver control part 12.

Receiver circuit part 11 executes a frequency reception process to receive the radio station corresponding to the input channel key in response to this frequency reception request.

Also, receiver control part 12 retrieves, from data storage part 13, the radio station data relating to the frequency reception request, judges whether or not the location data corresponding to the radio station data relating to the frequency reception request which has now been retrieved is inside the data storage part 13, and if the relevant location data is present it supplies this location data to the main unit control part 17. Main unit control part 17 generates display data based on this location data, and displays the generated display data on display part 15.

Also, receiver control part 12 retrieves, from data storage part 13, radio station data relating to the frequency reception request, and if the location data corresponding to the radio station data relating to the frequency reception request is not present in data storage part 13, the code "00" is substituted, and the "00" code is supplied to the main unit control part 17. The main unit control part 17 generates display data based on the "00" code, and displays the generated display data on display part 15.

Next, the operation of setting new last area data in last area data storage part 16—which is to say the operation performed when modifying the last area data stored in last area data storage part 16—is described.

The last area data is set by jumping to an operation to input and preset new last area data after data relating to the last area data currently stored in last area data storage part 16 has been displayed on display part 15.

When main unit control part 17 receives key input to activate the initiation of modification of last area data from keypad part 14, it reads the last area data that is currently stored in last area data storage part 16 and supplies the area data it has read to receiver control part 12.

Receiver control part 12 retrieves from data storage part 13 location data corresponding to the supplied area data, and supplies the retrieved location data to main unit control part 17.

Main unit control part 17 generates display data based on the retrieved location data, and supplies the generated display data to display part 15 where it is displayed.

Next, when main unit control part 17 receives key input to preset new last area data from keypad part 14, it supplies receiver control part 12 with a last area data modification request that instigates the modification of last area data.

Note that the method for inputting and setting new last area data is arranged such that, by using the UP key and DOWN key in keypad part 14, the next item of area data in alphabetical order can be called up by pressing the UP key, and the next item of data in reverse alphabetical order can be called up by pressing the DOWN key, and after the required state has been selected by inputting the first two letters of the name of each state in North America with the UP key and DOWN key, for example, the name of a city in the state is selected with the UP key and DOWN key.

When receiver control part 12 receives a last area data modification request, it computes the modified area data based on the previous last area data, retrieves the location data corresponding to this area data from data storage part 13, and supplies the retrieved location data to main unit control part 17.

Main unit control part 17 generates display data based on the location data, and supplies the generated display data to display part 15, where it is displayed. Also, when main unit control part 17 receives key input from keypad part 14 that causes area data relating to location data to be stored in last area data storage part 16, area data based on the location data is stored in last area data storage part 16 as last area data, and then display data indicating the completion of last area data storage is generated, and the generated display data is supplied to the said display part 15, where it is displayed.

Thus, with radio receiver device 50 with ID-logic function, a single item of last area data in an area that is frequently used is pre-stored in last area data storage part 16, so that it is possible for the user to cut down on the effort involved in inputting and setting last area data in an area that is frequently used.

However, there has been the problem that although the above-mentioned conventional radio receiver device 50 with ID-logic function is arranged such that a single item of area data is stored in last area data storage part 16, for example in an area that is frequently used, in cases such as receiving a radio station in an area outside the area relating to the last area data stored in last area data storage part 16, for example when one moves from Long Beach, Calif., the area corresponding to the last area data stored in last area data storage part 16, to Los Angeles, Calif., an area outside the area relating to the last area data stored in last area data storage part 16, and receives a radio station in this area, it is necessary to re-set the last area data in this area; in other words, every time a user moves to an area outside the area relating to the last area data previously stored in last area data storage part 16 and receives a radio station in this area, the user has had to re-input and set the last area data in the area to which he or she moved.

SUMMARY OF THE INVENTION

The present invention has been devised taking this disadvantage into account, and its aim is to provide a radio receiver device with improved operating characteristics in terms of the setting and input of last area data.

For this purpose, according to the present invention, there is provided a device having a data storage means that stores location data linking area data in which each area is identified and radio stations data for receivable radio stations situated in each of these areas, a receiving means that receives the broadcast waves of a radio station situated in the corresponding area based on preset location data, an area selection means that selectively calls up area data from the data storage means (S32, S33, S40 and S41 in FIG. 5), a last preset memory that sequentially updates and stores, for each selection, the area data selected by the area selection means, a preset memory that is capable of storing a plurality of items of area data, an area data writing means that writes area data read from the data storage means into the preset memory according to a specific first operation (S35, S36 and S37 in FIG. 5), and an area data reading means that selectively reads area data that is stored in the preset memory, and rewrites the last preset memory with this area data that is read according to a specific second operation (S35, S36 and S41 in FIG. 5).

Due to such a configuration, with a radio receiver device according to the present invention, a plurality of items of area data are stored in a preset memory, and when modifying the currently set last area data, area data that corresponds to the modified last area data is retrieved from an area data storage means, the location data corresponding to this retrieved area data is retrieved from a data storage means, and one can tune to radio stations in this retrieved location data, so that even in cases involving movement between a plurality of areas, it is unnecessary for the user to re-set and input the last area data in the area to which he or she moved every time he or she does so, and it is possible to markedly improve the operating characteristics relating to the setting and input of last area data.

BRIEF DESCRIPTION OF THE DRAWINGS

FIG. 2 shows an explanatory diagram of the receiver preset memory region of the preset memory;

FIG. 3 shows an explanatory diagram of the area data preset memory region of the preset memory;

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein.

Figure 1:
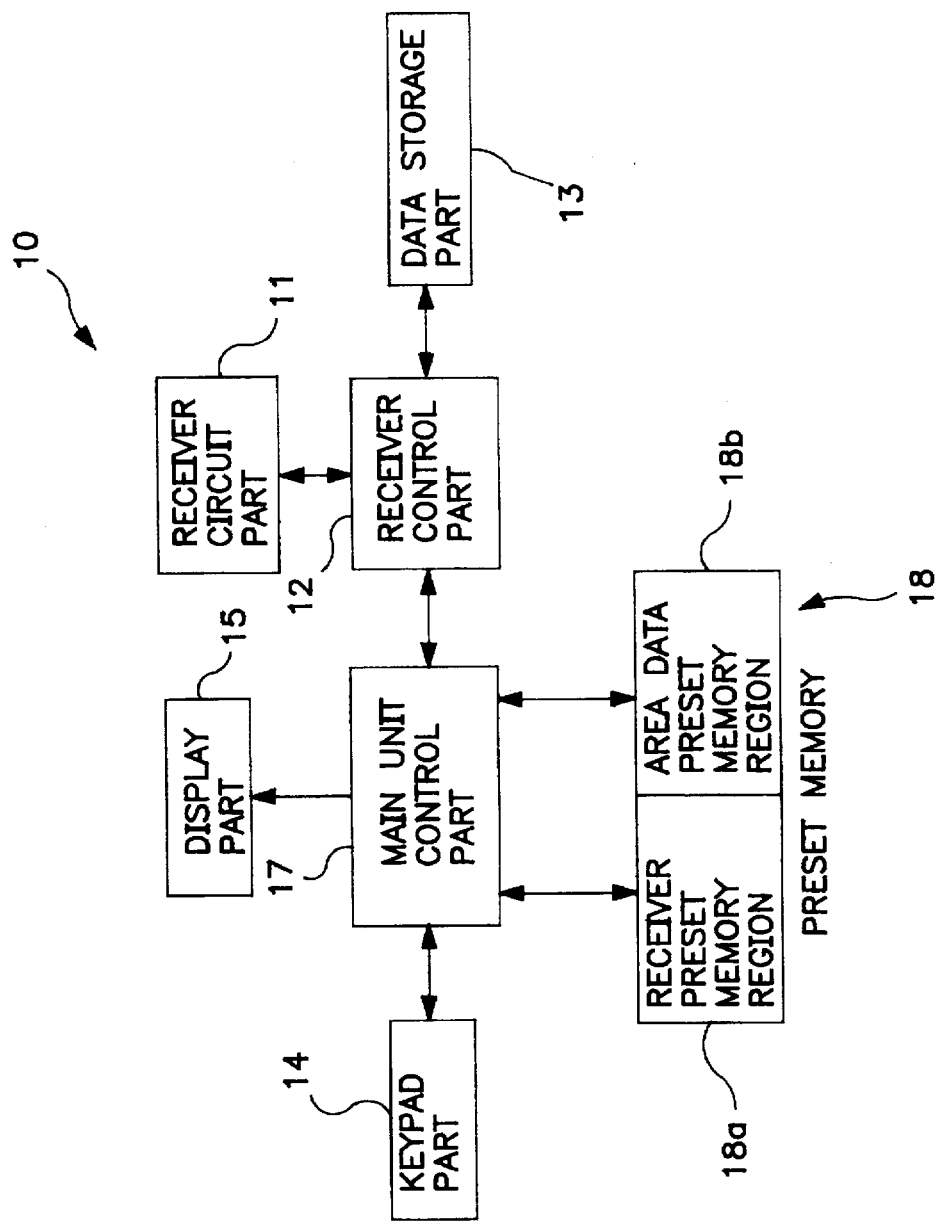
FIG. 1 shows a block diagram of the schematic configuration of a radio receiver device with ID-logic function applied to a radio receiver device according to the present invention.

In the following, a radio receiver device with ID-logic function applied to a radio receiver device according to the present invention is described based on FIG. 1.

Preset memory 18 has receiver preset memory region 18a which stores the reception frequency of each radio station set in each of the channel keys provided in keypad part 14, and area data preset memory region 18b which is an area data storage means that stores area data relating to each area set in each of the channel keys. Note that in the case of the present embodiment, the channel keys comprise six keys, and it is thus possible to store up to six items of area data.

The principle objective of the present invention is to pre-store a plurality of items of area data in preset memory 18, and to make it possible to set the required area data from the stored area data with a single key-press operation.

In the following, the operation of radio receiver device 10 with ID-logic function is described.

The receiver preset registration process is a process to store the reception frequency of each radio station in receiver preset memory region 18a corresponding to each of the channel keys.

As shown in FIG. 2, the main unit control part 17 reads the last reception frequency stored in the last position memory of receiver preset memory region 18a, the last reception frequency it has read is then received via receiver control part 12 by receiver circuit part 11, which is a receiving means, and the last reception frequency it has read is displayed on display part 15 (Step S11). Note that the last reception frequency corresponds to the reception frequency that is finally received by receiver circuit part 11.

Next, main unit control part 17 judges whether or not the UP key has been pressed (Step S12). If the UP key has been pressed, it raises the reception frequency (Step S13) and judges whether or not there is a radio station corresponding to the raised reception frequency (Step S14).

If this radio station is present, it stores the reception frequency that is currently being received in the last position memory of the receiver preset memory region 18a, the reception frequency is displayed on display part 15 (Step S15), and it judges whether or not a channel key has been pressed (Step S16).

If a channel key has been pressed, it judges whether or not the pressing operation was a long press (Step S17). If it was a long press, it stores the reception frequency of the last position memory in the receiver preset memory region 18a corresponding to the pressed channel key (Step S18), and judges whether or not the last area data modification mode key has been pressed (Step S19).

If the last area data modification mode key has not been pressed, it judges whether or not another mode key has been pressed (Step S20). If another mode key has been pressed, it concludes the receiver preset registration process.

If the UP key has not been pressed in Step S12, it judges whether or not the DOWN key has been pressed (Step S21). If the DOWN key has been pressed, it lowers the reception frequency (Step S22) and judges whether or not there is a radio station corresponding to the lowered reception frequency (Step S23). If this radio station is present, it jumps to Step S15.

Also, if no station is received in Step S14, it jumps to Step S13. Also, if no station is received in Step S23, it jumps to Step S22. Also, if none of the channel buttons have been pressed in Step S16, it jumps to Step S19.

If the pressing of the channel key in Step S17 was not a long press, it reads the reception frequency from receiver preset memory region 18a corresponding to the pressed channel key, writes the reception frequency that is called up to the last position memory of the receiver preset memory region 18a, displays the reception frequency on display device 15 (Step S24), and jumps to Step S19.

If the last area data modification mode key has been pressed in Step S19, it jumps to the last area data setting process (Step S30) mentioned hereinbelow. If none of the other mode keys has been pressed in Step S20, it jumps to Step S12.

Figure 4:
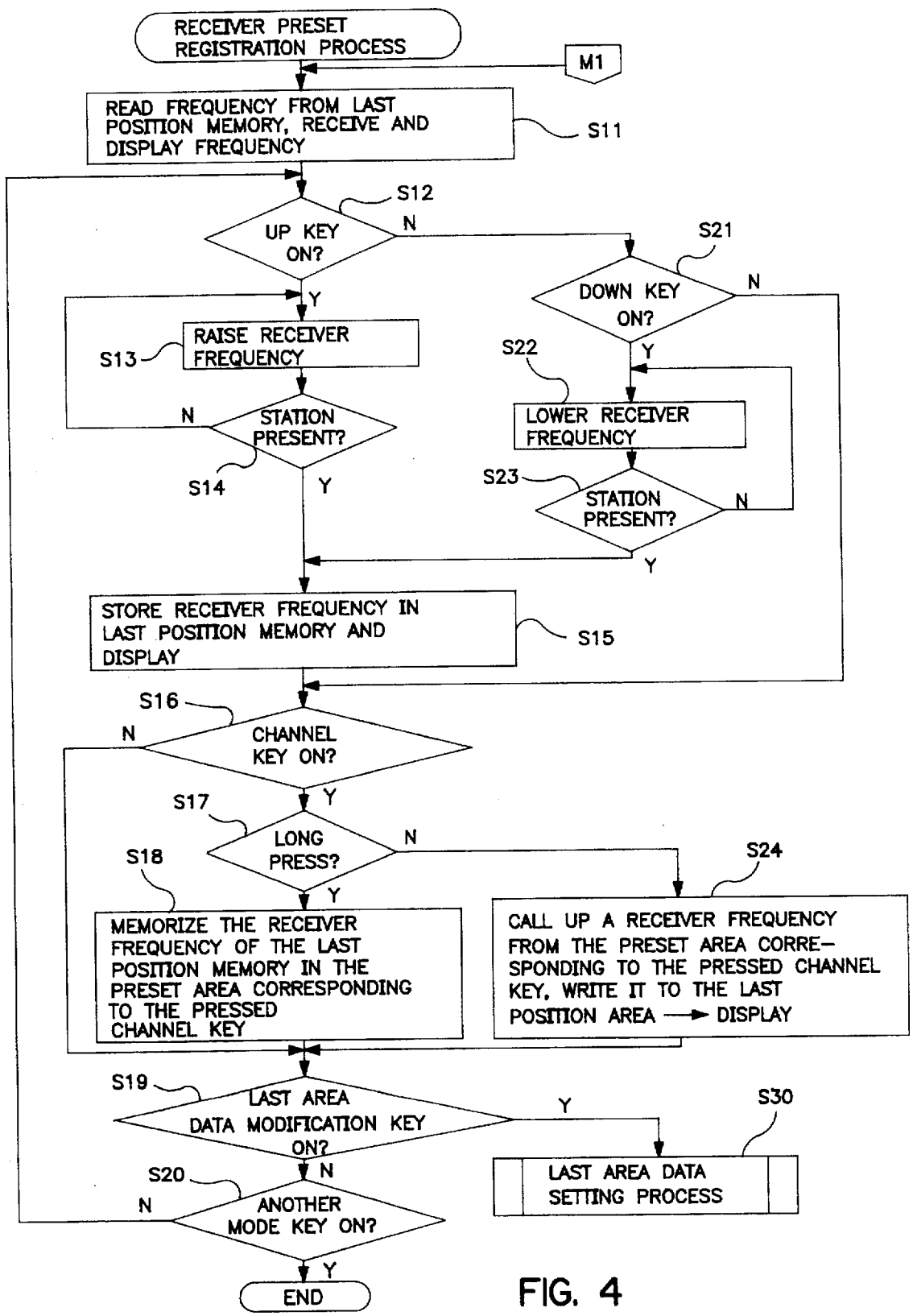
FIG. 4 shows a flowchart of the processing operations of the main unit control part in the receiver preset registration process for a radio receiver device with ID-logic function.

In short, the receiver preset memory registration process shown in FIG. 4 is arranged such that with a long press operation of a channel key, the reception frequency relating to the radio station that is currently being received is stored in the memory region corresponding to the receiver preset memory region, and with a short press operation of a channel key, the radio station corresponding to the channel key is received based on the memory region of the receiver preset memory region.

In the following, the last area data setting process of Step 30 is explained.

Figure 5:
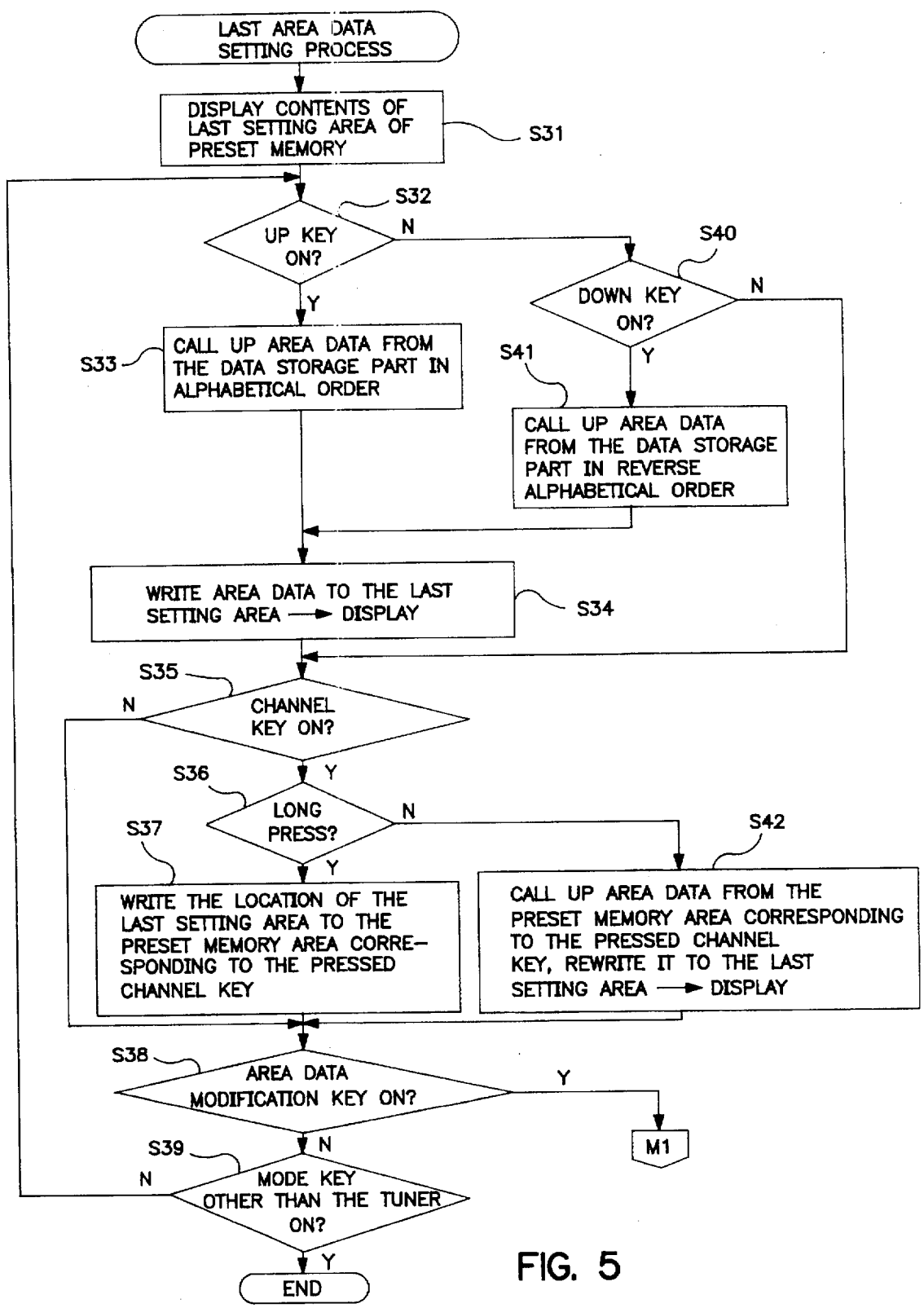
FIG. 5 shows a flowchart of the processing operations of the main unit control part in the last area data setting process for a radio receiver device with ID-logic function according to the present invention.
Figures 6, 7:
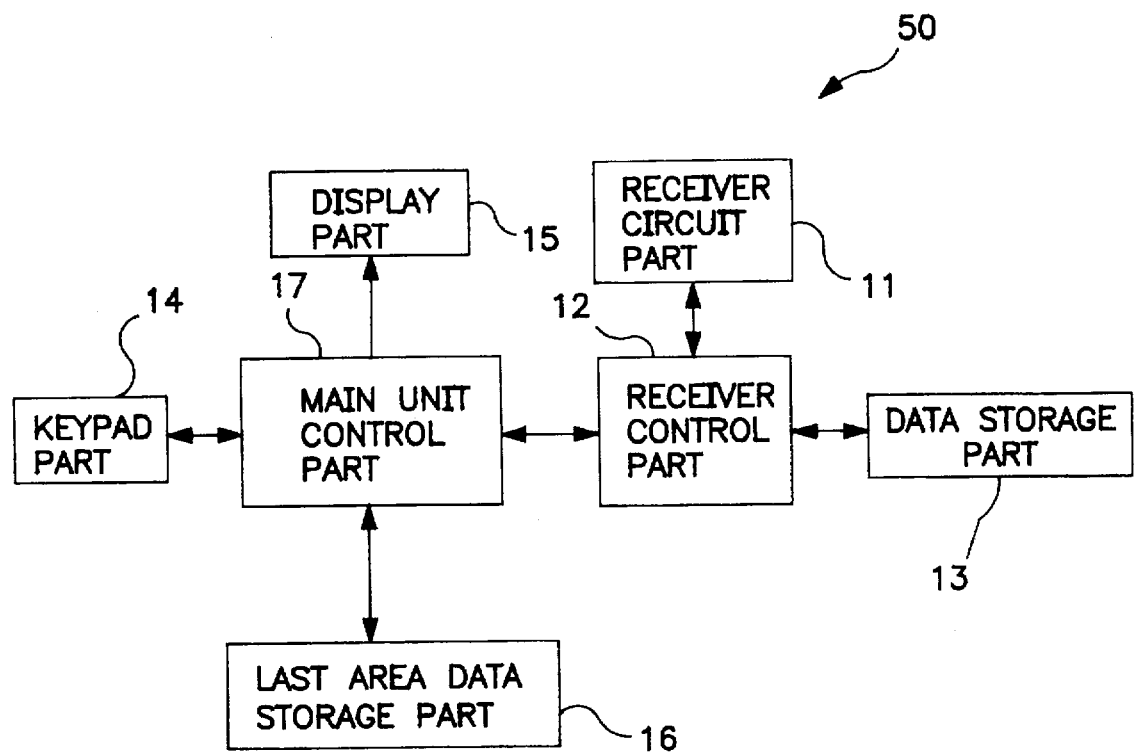
FIG. 6 shows a block diagram of the schematic configuration of a radio receiver device with ID-logic function.
FIG. 7 shows a plan view showing the preset keys of the keypad part in the radio receiver device with ID-logic function shown in FIG. 6.

In FIG. 5, main unit control part 17 displays the memory contents of the last position of the area data preset memory (referred to simply as "last preset memory" hereinbelow) of area data preset memory region 18b of preset memory 18 on display part 15 (Step S31), and judges whether or not the UP key has been pressed (Step S32).

If the UP key has been pressed, it calls up area data in alphabetical order from data storage part 13, which is a data storage means, selects the required area data (Step S33), writes the selected area data to the last preset memory and supplies the data of the area data to display part 15 where it is displayed (Step S34), and judges whether or not a channel key has been pressed (Step S35).

If a channel key has been pressed, it judges whether or not the channel key pressing operation was a long press (Step S36). If the pressing operation was a long press, it writes the area data of the last preset memory to the portion of the area data preset memory region 18b corresponding to the pressed channel key (Step S37), and judges whether or not the last area data modification key has been pressed (Step S38). If the last area data modification key has not been pressed, it judges whether or not a mode key other than the one for the tuner mode has been pressed (Step S39).

If a mode key other than the tuner mode has been pressed, it concludes the setting process. If a mode key other than the one for the tuner mode has not been pressed, it jumps to Step S32.

If the UP key has not been pressed in Step S32, it judges whether or not the DOWN key has been pressed (Step S40). If the DOWN key has been pressed, it calls up the area data in reverse alphabetical order from data storage part 13, selects the required area data (Step S41), then jumps to Step S34.

If the DOWN key has not been pressed in Step S40, it jumps to Step S35. If the channel key has not been pressed in Step S35, it jumps to Step S38.

Also, if the channel key pressing operation in Step S36 is not a long press, it reads the area data from area data preset memory region 18b corresponding to the pressed channel key, replaces the area data it has read in the last setting memory and displays the area data on display part 15 (Step S42), then jumps to Step S38.

Also, if the last area data modification key has been pressed in Step S38, it jumps to M1 shown in FIG. 4.

Thus, with the abovementioned embodiment, a plurality of items of area data are pre-stored in area data preset memory region 18b of preset memory 18, and when key input from a channel key that modifies the currently set last area data is detected, area data that corresponds to the modifying location data is retrieved from area data preset memory region 18b, the location data corresponding to the retrieved area data is retrieved from data storage part 13, and the radio stations in the retrieved location data can be tuned into, so that even in cases involving motion between a plurality of areas, it is unnecessary for the user to re-set and input the area data in the area to which he or she moved every time he or she does so, and it is possible to markedly improve the operating characteristics in terms of the setting and inputting of area data.

Note that the arrangement of the abovementioned embodiment is such that the modification of the last area data is initiated with the input of a channel key, but the modification of the last area data may also be initiated when the received level drops below a certain level upon detecting the received level of broadcast waves from the radio station currently being received.

What is claimed is:

1. A device comprising:

a data storage means that stores location data linking area data in which each area is identified and radio stations data for receivable radio stations situated in each of these areas a receiving means that receives the broadcast waves of a radio station situated in the corresponding area based on preset location data, an area selection means that selectively calls up area data from the data storage means, a last preset memory that sequentially updates and stores, for each selection, the area data selected by the area selection means, an area data preset memory that is capable of storing a plurality of items of area data, an area data writing means that writes area data read from the data storage means into the area data preset memory according to a specific first operation performed by a first operating means, and an area data reading means that selectively reads area data that is stored in the area data preset memory, and rewrites the last preset memory with this area data that it has read according to a specific second operation performed by a second operating means.

2. The device of claim 1, wherein the operating means that performs the first operation is a preset key that instigates the initiation of reception of broadcast waves from the radio station preset for each key.

3. The device of claim 1, wherein the operating means that performs the second operation is a preset key that instigates the initiation of reception of broadcast waves from the radio station preset for each key.

4. The device of claim 1, wherein the first and second operating means preform switching selection according to the operation time of the preset key.

5. The device of claim 1, further comprising an area modification mode setting means for setting the area data preset in the last preset memory into the modifying area modification mode, and the first operation and the second operation is enabled by setting said device in area modification mode using said mode setting means.

6. The radio receiver device of claim 5, characterized in that the area modification mode is initiated following movement between various areas.

* * * * *